US008633050B2

(12) United States Patent
Pierreux

(10) Patent No.: US 8,633,050 B2
(45) Date of Patent: Jan. 21, 2014

(54) SOLAR CELL, AND METHOD OF MANUFACTURING THE SAME

(75) Inventor: Dieter Pierreux, Almere (NL)

(73) Assignee: ASM International N.V., Almere (NL)

( * ) Notice: Subject to any disclaimer, the term of this patent is extended or adjusted under 35 U.S.C. 154(b) by 306 days.

(21) Appl. No.: 13/112,342

(22) Filed: May 20, 2011

(65) Prior Publication Data

US 2011/0284079 A1  Nov. 24, 2011

Related U.S. Application Data

(63) Continuation of application No. 61/347,059, filed on May 21, 2010.

(51) Int. Cl.
*H01L 21/00* (2006.01)

(52) U.S. Cl.
USPC ......... 438/57; 438/778; 136/261; 257/E21.24

(58) Field of Classification Search
USPC .................. 438/57, 63, 758, 773, 778, 788; 136/261; 257/E21.24
See application file for complete search history.

(56) References Cited

U.S. PATENT DOCUMENTS

| 7,491,634 B2 * | 2/2009 | Huotari et al. ................ 438/592 |
| 2008/0131601 A1 | 6/2008 | Kim et al. |
| 2011/0284079 A1 * | 11/2011 | Pierreux ...................... 136/261 |

* cited by examiner

*Primary Examiner* — Jack Chen

(74) *Attorney, Agent, or Firm* — Preti Flaherty Beliveau & Pachios LLP

(57) ABSTRACT

A method of manufacturing a solar cell having an effective minority charge carrier lifetime ($\tau_{eff}$) of at least 500 μs, said method comprising:
  providing a semiconductor wafer; and
  passivating a surface of said wafer by ALD-depositing a metal oxide layer on said surface by sequentially and alternatingly:
  (iii) exposing said surface to a first precursor, resulting in a coverage of the surface with the first precursor, and
  (iv) exposing said surface to a second precursor, resulting in a coverage of the surface with the second precursor,
wherein at least one of steps (i) and (ii) is stopped before the coverage of the surface reaches a saturation level.

22 Claims, 8 Drawing Sheets

SOLAR CELL, AND METHOD OF MANUFACTURING THE SAME

FIELD OF THE INVENTION

The present invention relates to the field of semiconductor processing, and more in particular to the manufacture of a solar cell having a rear surface provided with a passivating thin metal oxide layer.

BACKGROUND

In a silicon solar cell minority charge carriers may recombine at defects, impurities, surface damage, etc. before reaching the contacts. Such recombination diminishes the current output of the solar cell, and hence its efficiency. To reduce the occurrence of recombinations at the rear surface of a solar cell, this surface may be passivated by providing it with a metal oxide passivation layer, e.g. an aluminum oxide ($Al_2O_3$) layer. Successful passivation results in an increased effective minority charge carrier lifetime ($\tau_{eff}$).

It is an object of the present invention to provide for a method that enables the economical manufacture of solar cells having a high effective minority charge carrier lifetime (i.e. $\tau_{eff} \geq 500$ μs).

SUMMARY

Accordingly, one aspect of the present invention is directed to a method of manufacturing a solar cell having an effective minority charge carrier lifetime of at least 500 μs. The method comprises providing a semiconductor wafer. The method further comprises passivating a surface of said wafer by ALD-depositing a metal oxide layer on said surface by sequentially and alternatingly (i) exposing said surface to a first precursor, resulting in a coverage of the surface with the first precursor, and (ii) exposing said surface to a second precursor, resulting in a coverage of the surface with the second precursor. At least one of the steps (i) and (ii) is stopped before the coverage of the surface reaches a saturation level.

Another aspect of the present invention is directed to a solar cell that is at least partly manufactured in accordance with the method according to the invention.

The method according to the present invention finds basis in experiments to be described in more detail hereafter, which have surprisingly revealed that metal oxide passivation layers deposited using sub-saturated ALD, i.e. ALD performed at a smaller than maximal growth per cycle-rate (GPC; measured in Å/cycle), may provide excellent passivation properties. The experiments were concerned with aluminum oxide layers that were applied using two gaseous precursors: trimethylaluminum (TMA) and ozone ($O_3$). It is conjectured, however, that other metal oxide layers of different materials and/or deposited using different precursors may exhibit similar characteristics.

Within the framework of sub-saturated ALD, multiple process parameters of the deposition process of the aluminum oxide passivation layer have been observed to have a pronounced influence on the effective minority charge carrier lifetime of a solar cell. These parameters include the wafer temperature at which deposition of the passivation layer takes place, the ozone concentration to which the substrate is exposed during ozone precursor exposures/pulses, and the thickness of the applied layer.

A careful selection of deposition process parameters ranges may yield highly effective passivation layers capable of boosting the efficiency of solar cells. Advantageously, such selection of parameters may also lower the costs and increase the overall efficiency of the solar cell production process.

These and other features and advantages of the invention will be more fully understood from the following detailed description.

DETAILED DESCRIPTION

ALD is a deposition method that allows for the deposition of thin layers in a precisely controlled way. Typically, ALD uses two or more gaseous precursors that are alternately and repeatedly applied to a substrate. A series of sequential steps in which a surface of the substrate is exposed to all precursors is called a deposition cycle. Each deposition cycle typically grows a single monolayer of the desired layer. This is due to the fact that in ALD the layer growth depends on chemisorption, a process whereby a precursor molecule adheres to a substrate's surface through the formation of a chemical bond without further thermal decomposition of the precursor molecule taking place. Chemisorption stops naturally when all substrate surface sites available for chemical bonding with a precursor have been covered. Exposing the substrate to the second precursor results in a chemical reaction of the second precursor with the chemisorbed first precursor under the formation of a solid layer, until all of the chemisorbed first precursor has been reacted and the substrate is covered with chemisorbed second precursor in a self-limiting manner. Consequently, ALD is a deposition method that enables highly conformal coating by high quality layers. These characteristics make it a method of interest to various industries, among which in particular the semiconductor, and more specifically, the solar cell industry.

Figure 1:
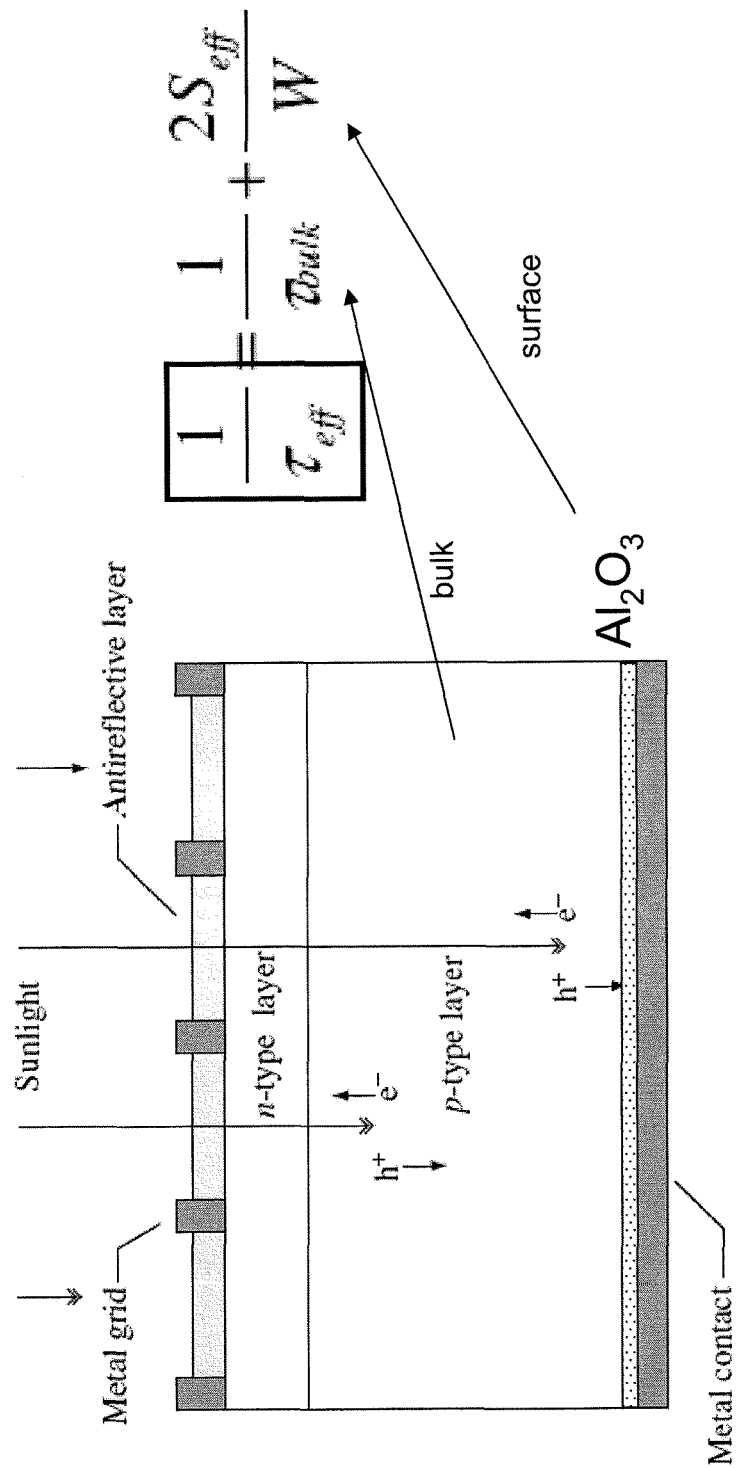
FIG. 1 is a schematic cross-sectional side view of an exemplary solar cell according to the present invention on which sunlight is incident.

One ALD application in the solar cell industry is the deposition of passivation layers on the rear surface of a solar cell. FIG. 1 is a schematic cross-sectional side view of an exemplary solar cell that features such a passivation layer. The solar cell comprises a crystalline silicon body, which during production of the cell is referred as a 'wafer'. Electrical current generated in the body is extracted via electrical contacts at the front and the rear of the cell. The front contact structure is made in the form of a widely spaced metal grid that allows light to pass through. Within the openings of the grid the front surface of the cell is provided with an anti-reflection coating to minimize light reflection. At the rear surface, the silicon body is provided with the aluminum oxide ($Al_2O_3$) passivation layer whose primary function is to prevent the undesired recombination of generated minority charge carriers at the back surface. On top of the passivation layer a full area metal back contact is provided. Through proper doping, the silicon body is provided with a p-n junction near its light receiving surface. During operation, light incident on the cell generates electron ($e^-$)-hole ($h^+$) pairs on both sides of the p-n junction, i.e. both in the n-type emitter and in the p-type base. Electrons generated in the base diffuse across the p-n junction towards the emitter, while holes generated in the emitter diffuse across the junction towards the base, thus producing an electric voltage across the cell.

Of great importance to the current production of the cell is the effective minority charge carrier lifetime $\tau_{\it eff}$. Without going into unnecessary detail here it is noted that, mathematically, $\tau_{\it eff}$ is essentially made up of two components: one related to properties of the body or bulk of the cell, and one related to the surface thereof. It is the latter component that is to a large extent determined by the properties of the passivation layer.

To optimize the properties of the passivation layer, so as to optimize the respective component of $\tau_{\it eff}$, experiments have been conducted in which an the aluminum oxide layer was applied to a silicon wafer's rear surface using different ALD process recipes. Common to all recipes is the alternate and repeated exposure of said surface to two gaseous precursors, trimethylaluminum (TMA) and ozone ($O_3$). By executing multiple deposition cycles a layer having a thickness up to 30 nm was grown. Following the deposition of the layer, the effective minority charge carrier lifetime $\tau_{\it eff}$ of the solar cell was determined.

The experimental setup used to conduct the experiments comprises, insofar as relevant here, a conventional vertical semiconductor processing furnace. The furnace features a heatable reaction chamber capable of receiving a wafer boat that accommodates a batch of wafers. Within the boat, the wafers are arranged in a stacked, mutually spaced relationship. Multiple wafers are thus treated simultaneously, which allows for mutual (wafer-to-wafer) comparison afterwards. A motor device is provided to rotate the wafer boat during deposition treatment of the wafers. Precursor and purge gases are supplied to and discharged from the reaction chamber through a series of conduits, fitted with controllable valves for gas flow control. TMA precursor gas and nitrogen ($N_2$) purge gas are drawn directly from pressurized source containers, while ozone ($O_3$) is synthesized using an ozone generator feeding on oxygen gas ($O_2$). Oxygen supplied to the ozone generator but not converted into ozone serves as a carrier gas for the ozone and is, as such, also supplied to the reaction chamber.

Turning now to the different ALD processes. Table 1 lists the exposure times for three different ALD recipes: RCP1, RCP2 and RCP3. For example, as can be inferred from Table 1, RCP1 involves the consecutive exposure of the rear surface of the wafer (i.e. the rear surface of the solar cell) to a TMA flow for 15 seconds, to a flow of purge gas for 14 seconds, to an ozone flow for 30 seconds, and to another purge gas flow for 10 seconds. The rightmost column of Table 1 lists the duration in seconds of a single ALD deposition cycle, e.g. 69 seconds for RCP1, which follows from a summation of the durations of the precursor and purge gas exposure times.

TABLE 1

|  | TMA (s) | Purge (s) | O3 (s) | Purge (s) | total (s) |
|---|---|---|---|---|---|
| RCP1 | 15 | 14 | 30 | 10 | 69 |
| RCP2 | 8 | 5 | 5 | 5 | 23 |
| RCP3 | 4 | 2 | 3 | 2 | 11 |

Although the individual pulse or step times might be reduced further beyond the values given in Table 1, pulse times shorter than 1 second are not effective in adequately exposing all substrates in a batch reactor to a reactant or in adequately purging the reactor.

Table 2 lists the primary process parameters of the three recipes mentioned in Table 1. These parameters include—from left to right in the table—the mass flow rate of TMA into the reaction chamber during a TMA pulse or exposure (in grams per minute), the mass flow rate of oxygen fed to the ozone generator during an ozone pulse (in standard liters per minute), the ozone concentration in the oxygen flow leaving the ozone generator (in grams per cubic meter), the pressure range maintained in the reaction chamber during deposition (in millitorrs), the wafer temperature during deposition (in degrees Celcius), and the final layer thickness of the deposited aluminum oxide layer (in nanometers).

For RCP2, Table 2 lists two ALD recipe variations: RCP2 (1) and RCP2(2). RCP2(1) differs from standard RPC2 in that it employs a lower ozone concentration of 220 g/m$^3$, instead of 300 g/m$^3$. RCP2(2) differs from standard recipe RCP2 in that it effects a smaller final layer thickness of 20 nm, instead of 30 nm; that is to say, RCP2(2) involves only two-thirds of the number of ALD deposition cycles used in standard RCP2.

The wafer temperature maintained during deposition is 175° C. for all listed ALD recipes. This is because preliminary experiments have indicated that temperatures in the range of 150-200° C. are consistent with the highest observed effective minority charge carrier lifetimes $\tau_{\it eff}$. Temperatures above 200° C. seem to unnecessarily promote detrimental oxidation of the substrate surface.

TABLE 2

|  | TMA flow (g/min) | O2 flow (slm) | O3 conc. (g/m3) | Press. mTorr | Temp ° C. | Thickn. nm |
|---|---|---|---|---|---|---|
| RCP1 | 0.3 | 1.76 | 300 | 100-200 | 175 | 30 |
| RCP2 | 0.3 | 1.76 | 300 | 100-200 | 175 | 30 |
| RCP3 | 0.3 | 1.76 | 300 | 100-200 | 175 | 30 |
| RCP2(1) | 0.3 | 1.76 | 220 | 100-200 | 175 | 30 |
| RCP2(2) | 0.3 | 1.76 | 300 | 100-200 | 175 | 20 |

Figure 2:
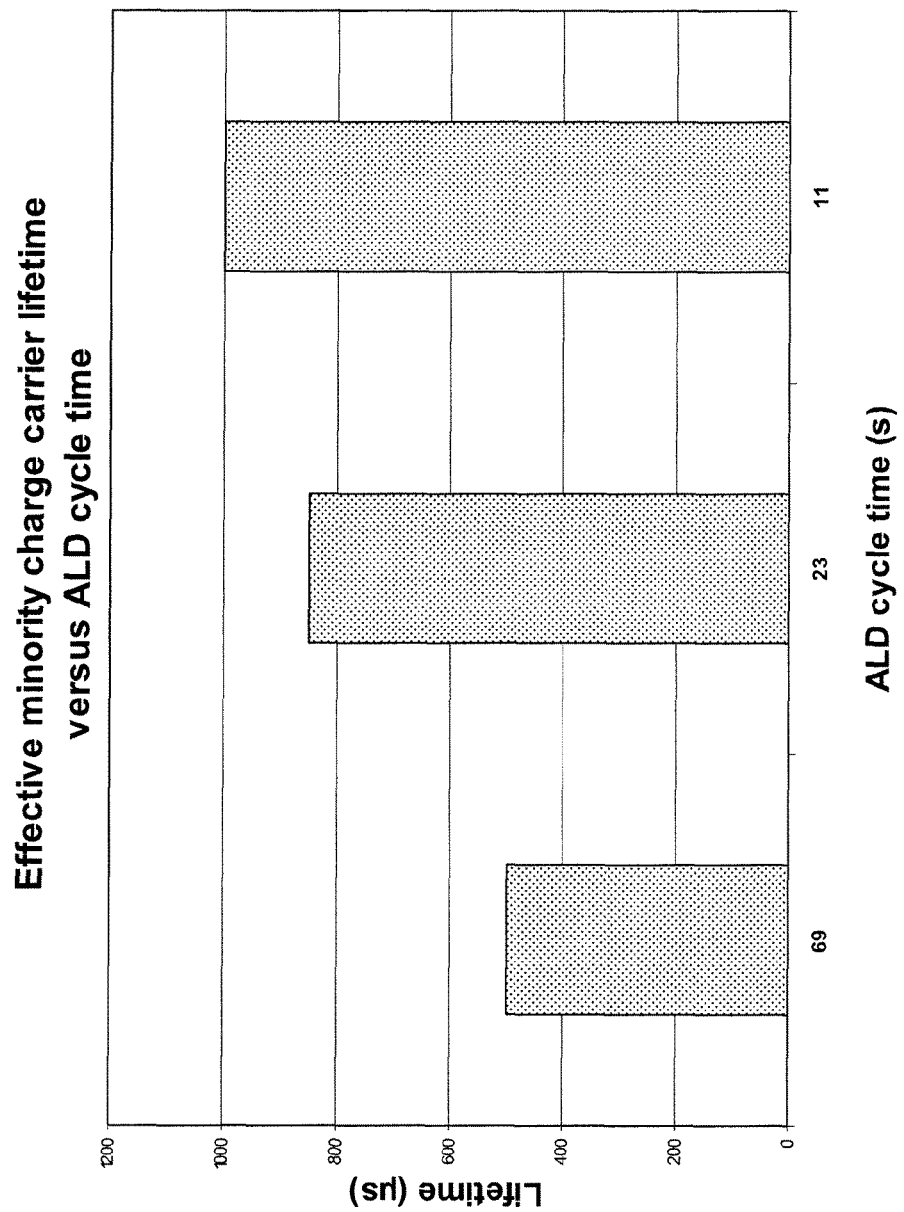
FIG. 2 is a bar graph illustrating the dependence of the effective minority charge carrier lifetime of a solar cell on the ALD cycle time with which a passivating $Al_2O_3$-layer is applied to the rear surface thereof.
Figure 3:
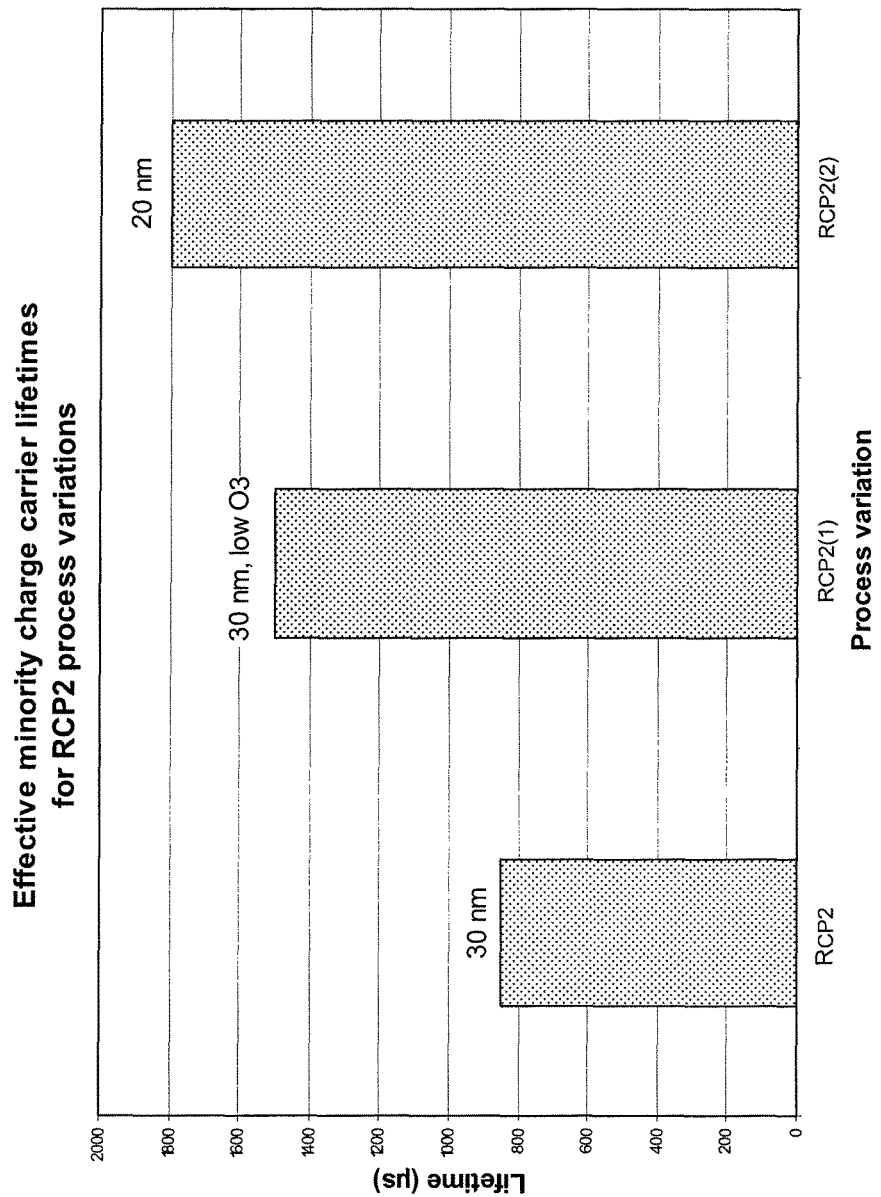
FIG. 3 is a bar graph illustrating the dependence of the effective minority charge carrier lifetime of a solar cell on a change in the ozone concentration of ozone precursor pulses during ALD deposition, and the overall layer thickness of the applied $Al_2O_3$-layer.

FIGS. 2 and 3 present some important experimental results. FIG. 2 is a bar graph that illustrates the effect of the ALD cycle time on the effective minority charge carrier lifetime $\tau_{\it eff}$ of the resulting solar cell. The graph shows three bars, respectively relating to solar cells having a passivating layer manufactured using RCP1, RCP2 and RCP3, and thus corresponding to ALD cycle times of 69, 23 and 11 seconds (see Table 1). The graph of FIG. 2 makes it clear that the ALD cycle time is a factor that affects the passivating properties of the deposited layer. The general relationship to be inferred from FIG. 2 is that, departing from RCP1, a smaller ALD cycle time may result in an increased $\tau_{eff}$. For each recipe the smaller ALD cycle time is a consequence of shorter exposures of the wafer surface to precursor and purge gases, as specified in Table 1. It is currently believed that the reduction in precursor exposure times, and in particular the reduction in ozone exposure times, is the most significant contributor to the positive effect on $\tau_{eff}$.

Generally speaking, the self-limiting reactions of an ALD process yield a growth per cycle (GPC, e.g. as measured in Å/cycle) that is observed to increase with the duration of the respective precursor exposures until a saturation level is reached. Saturation is characterized by the onset of the absence of a further increase of the GPC with a further increase of the precursor exposure times. None of the used ALD recipes attain full saturation or maximal growth per cycle rates: they are all concerned with sub-saturated ALD. Since it is the self-limiting nature of (saturated) ALD that is often regarded as being responsible for the high quality of the films, it is surprising to find sub-saturated ALD producing such effective passivation layers.

FIG. 3 is a bar graph with effective minority charge carrier lifetime data for the different RCP2 variations: RCP2 (standard), RCP2(1) and RCP2(2). The graph illustrates that $\tau_{eff}$ is dependent on variations in both the ozone concentration of the ozone precursor pulses (RCP2(1)) and the thickness of the deposited layer (RCP2(2)).

As far as the ozone concentration during ozone precursor pulses is concerned, the provisional conclusion drawn from the experiments is that high ozone concentrations adversely affect $\tau_{eff}$. It thus appears that preferably the ozone concentration is in a range of 0.1 to 500 g/m$^3$, more preferably the ozone concentration is in a range between 100 and 300 g/m$^3$ and most preferably the ozone concentration is about 220 g/m$^3$ to achieve optimum $\tau_{eff}$.

Regarding the thickness of the deposited passivation layer, the provisional conclusion drawn from the experiments is that layers having a thickness above 30 nm adversely affect $\tau_{eff}$. From additional experiments not presented here in detail, it is further derived that layers having a thickness below 10 nm may not provide for proper passivation. Accordingly, the layer thickness range 10-30 nm, and more particularly the layer thickness range 15-25 nm is conjectured to hold an optimum layer thickness value.

The use of sub-saturated ALD not only allows for the deposition of highly effective passivation layers, it also lowers the costs of the production process. More specifically, sub-saturated ALD enables a more efficient use of precursors while at the same time it allows for a greater wafer throughput. On the downside, the use of sub-saturated ALD is accompanied by a decline in layer thickness uniformity. As will be shown, however, such deterioration of thickness uniformity may be balanced against the aforementioned advantages so as to optimize the deposition process. These points will be illustrated with reference to FIGS. 4-8.

Figure 4:
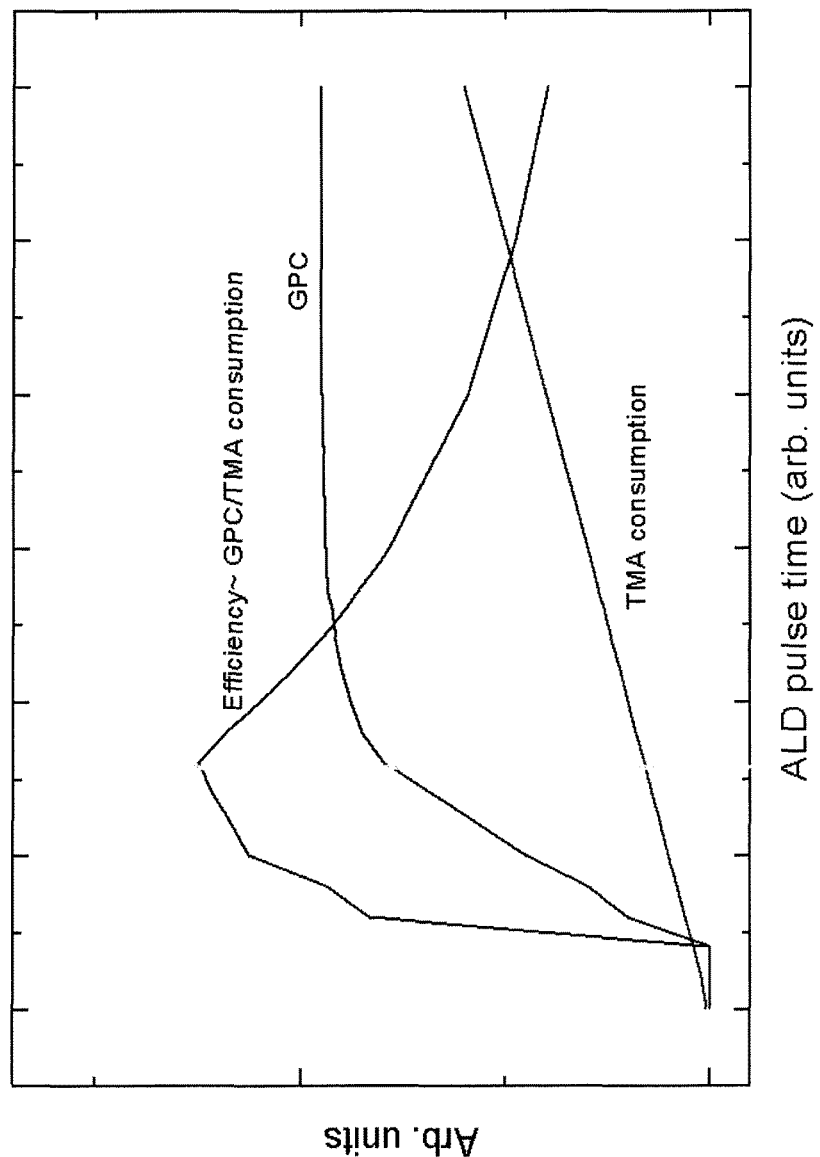
FIG. 4 schematically illustrates the efficiency curve of an ALD process in which TMA is used as a precursor.

FIG. 4 schematically illustrates the efficiency curve of an ALD process in which TMA, a relatively expensive precursor, is used. The line labeled 'TMA consumption' indicates the amount of the TMA that is fed to the reaction chamber as a function of the ALD cycle time. It will be clear that the TMA consumption increases linearly with the ALD cycle time. The curve labeled 'GPC' illustrates the growth per cycle, which increases with the ALD cycle time until a saturation level is reached. At that point the growth per cycle-curve levels off. The efficiency curve, obtained by dividing the GPC by the TMA consumption, illustrates the film thickness increment per unit of consumed TMA. The optimum of the efficiency curve lies well before the ALD cycle time at which a saturation level is attained. This means that when efficiently growing a film of a certain thickness is the objective, this is best done using sub-saturated ALD.

Figures 5, 6:
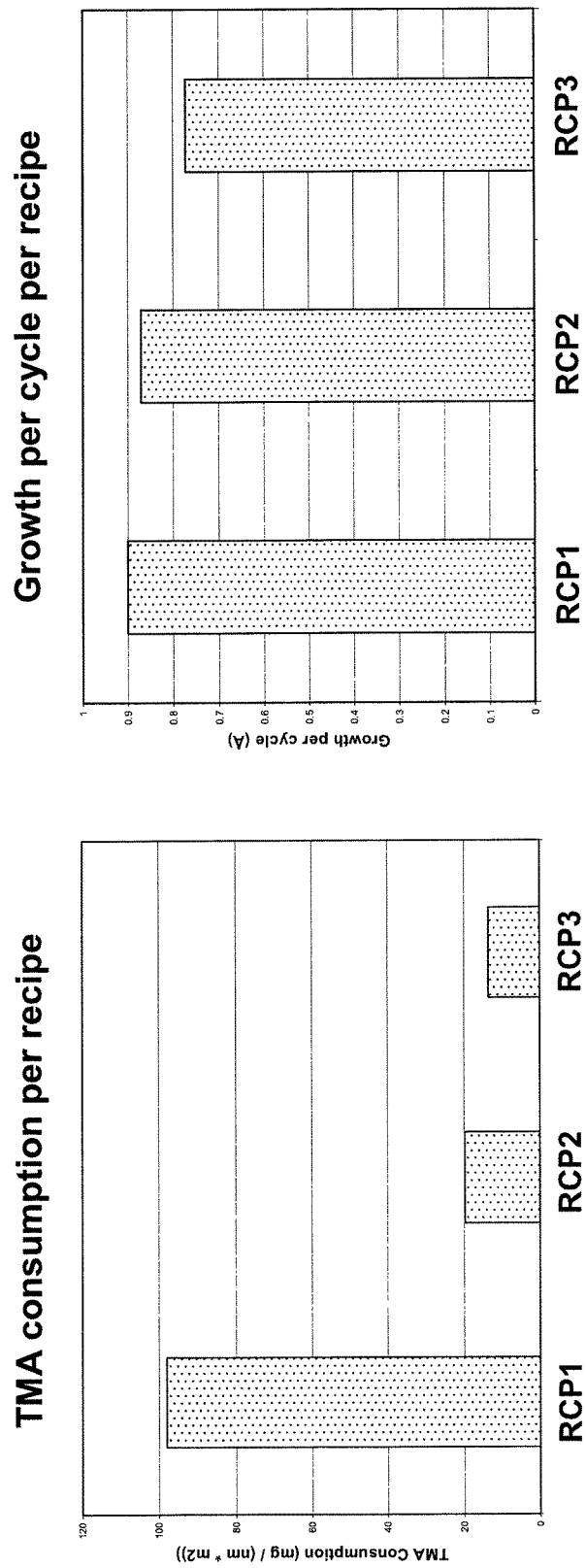
FIG. 5 is a bar graph illustrating the TMA consumption for each of the recipes listed in Table 1.
FIG. 6 is a bar graph illustrating the growth per cycle (GPC) for each of the recipes listed in Table 1.

FIG. 5 is a bar graph illustrating the TMA consumption for each of the ALD recipes RCP1, RCP2 and RCP3. For each recipe, the TMA consumption is given in the number of micrograms of TMA required to cover one square meter of wafer surface with an aluminum oxide layer of one nanometer thickness. For RCP1, RCP2 and RCP3 the TMA consumption is respectively 98 mg/(nm·m$^2$), 20 mg/(nm·m$^2$) and 14 mg/(nm·m$^2$).

The TMA consumption values in FIG. 5 are based on the amount of TMA that was extracted from the source container during the experiments. Not all TMA extracted from the source container was routed through the reaction chamber. In particular during deposition according to RCP1, a flow of TMA from the source container was allowed time to develop in order to attain the desired mass flow rate of 0.3 g/min (see Table 2) before it was routed into the reaction chamber. Practically, this means that for RCP1 only about 40% of the extracted or consumed TMA was actually delivered to the reaction chamber. During deposition according to RCP2 and RCP3 the flow of TMA was allowed less time to fully develop; accordingly, TMA flow supplied to the reaction chamber was not at the maximum flow rate during the entire exposure times listed in Table 1. For RCP2 and RCP3, the percentage of the consumed TMA that was actually delivered to the reaction chamber is 90%. This effect needs to be combined with the reduction in pulse lengths. FIG. 5 reflects the total amount of TMA extracted from the source per recipe. It can be observed that RCP1 is by far the most TMA-consuming recipe, while RCP3 is the least consuming.

FIG. 6 is a bar graph illustrating the growth per cycle (GPC), i.e. the layer thickness increment resulting from one ALD cycle, for each of the ALD recipes. The thickness increment is given in Ångstrom (Å), i.e. 0.1 nm. For RCP1, RCP2 and RCP3, the GPC is approximately 0.90 Å, 0.87 Å and 0.78 Å, respectively.

From FIGS. 5 and 6, it will be clear that the TMA efficiency of the deposition process, defined as the GPC divided by the TMA consumption, is smallest for RCP1 and greatest for RCP3. Furthermore, as can be inferred from Table 1 and FIG. 6, RCP3 provides for a relatively rapid method of depositing a layer. For example, using RCP3 depositing a 30 nm layer requires (30 nm/0.78 Å=) 385 ALD cycles, with each cycle requiring 11 seconds, so that the total ALD deposition time amounts to (385·11=) 4235 seconds, i.e. 1 hours and 11 minutes. In contrast, depositing a 30 nm layer using RCP1 requires (30 nm/0.90 Å=) 333 ALD cycles, with each cycle taking up 69 seconds, so that the total ALD deposition time amounts to (333·69=) 22977 seconds, i.e. 6 hours and 23 minutes. RCP3 is, in other words, more than 5 times faster than RCP1.

Figure 7:
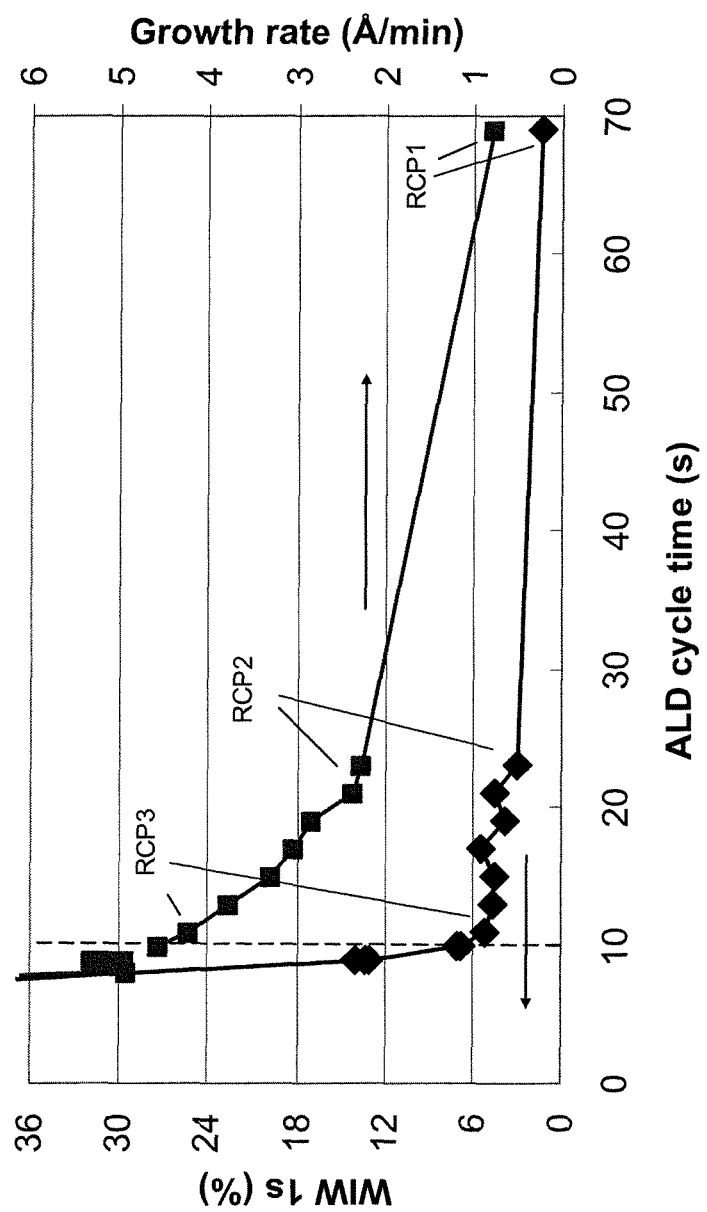
FIG. 7 is a graph illustrating the dependence of both layer thickness uniformity and layer growth rate on the ALD cycle time.

FIG. 7 is a graph illustrating both the variation in thickness of the deposited layer across the treated surface (lower curve) and the layer growth rate (upper curve) as a function of the ALD cycle time. The points in the graph corresponding to the recipes listed in Table 1 have been provided with an identifying label. That is, the label 'RCP1' refers to points at ALD cycle time 69 seconds, etc.

Figure 9:
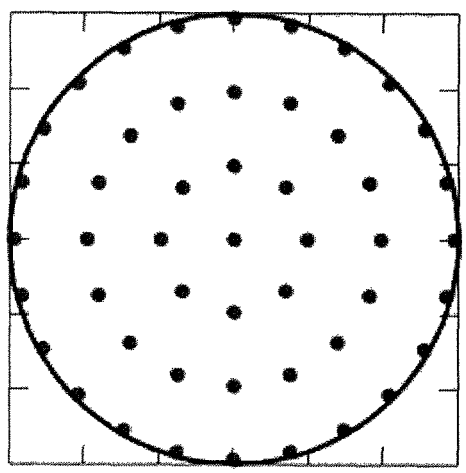
FIG. 9 schematically illustrates the locations on the surface of a circular wafer at which layer thickness measurements were taken to assess the within-wafer uniformity of the film thickness (WiW) and wafer-to-wafer uniformity of the film thickness (WtW).

The thickness variations in a deposited layer are specified in terms of the within-wafer uniformity ('WiW'). The WiW is the relative sample standard deviation of a population of forty-nine layer thickness measurements sampled at the wafer surface locations indicated in FIG. 9. FIG. 7 shows that RCP1, RCP2 and RCP3 respectively yield an WiW of about 1.3%, 3% and 5%. Hence it is observed that decreasing the ALD cycle time from 69 seconds to 11 seconds, according to the scheme of Table 1, results in a significant WiW-degradation of about 3.5%. For practical solar cell applications wafers coated with a passivating layer having a WiW-value of above about 10% are preferably avoided. Under the processing conditions of Table 2 it therefore seems preferred to use ALD cycle times above 10 seconds, indicated by the vertical dashed line, to the left of which the WiW seems to explode.

The layer growth rates provided by the upper curve in FIG. 7 have been calculated using the data from Table 1 and FIG. 6. For RCP3, for example, (60 seconds/11 seconds=) 5.5 ALD cycles can be executed in a minute time. Each ALD cycle provides for a layer thickness increment of 0.78 Å, so that the total growth rate for RCP3 amounts to (5.5·0.78 Å) 4.3 Å per minute.

FIG. 7 makes it clear that, departing from RCP1, the ALD cycle time may be decreased without excessive repercussions for the WiW-value of the deposited layer, at least down to approximately the ALD cycle time of RCP3. This latter recipe appears to allow for a relatively high if not optimal growth rate at an acceptable WiW-value of about 5%.

It must noted here that the experiments were carried out using boat rotation, i.e. rotation of the wafer boat relative to the gas injector outlets of the vertical furnace, so as to ensure a substantially homogenous application of the process gasses to the treated wafer surface. Computational fluid dynamics simulations have indicated that, in particular for small ALD cycle times on the order of RCP3, the absence of boat rotation would result in chemical vapor deposition (CVD) at the injector outlets, and serious process gas depletion at the side of the wafer surface distal to the injector outlets. Such depletion would in turn amount to unacceptable WiW-values.

Figure 8:
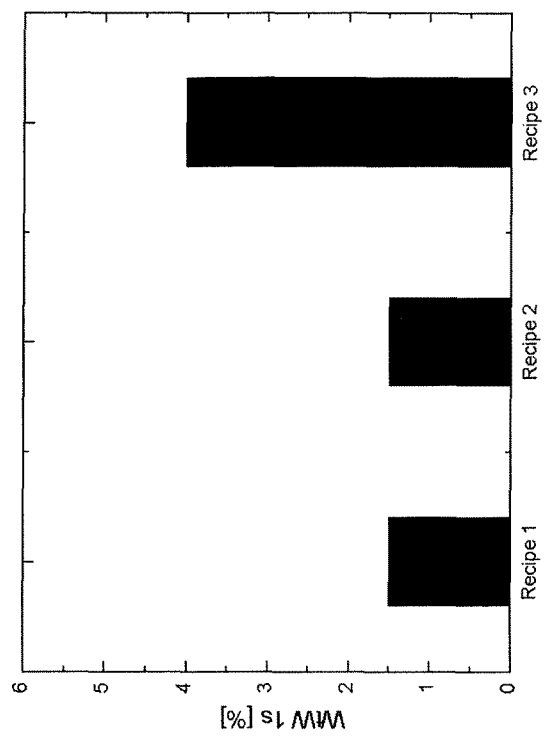
FIG. 8 includes two bar graphs that illustrate, for wafers processed with each of the recipes listed in Table 1, the values of the within-wafer uniformity of the film thickness (WiW) (left graph) and the wafer-to-wafer uniformity of the film thickness (WtW) (right graph)
Figure 8:
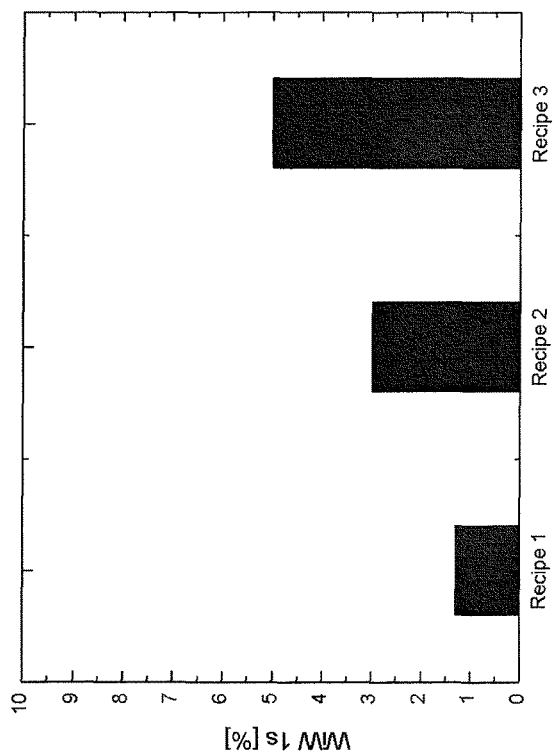

FIG. 8 includes two bar graphs. The graph on the left reproduces the WiW-data for RCP1-3 already shown in FIG. 7, in particular for comparison with the data in the graph on the right. This latter graph illustrates the variation in average layer thickness among wafers that were processed as part of the same batch. This variation is called the wafer-to wafer uniformity ('WtW'), which is the relative sample standard deviation of average layer thickness measurements on wafers that were processed simultaneously on different positions in the same batch. As can be inferred from FIG. 8 when comparing the WtW obtained for RCP3 to those obtained for RCP1 and RCP2, lowering the ALD-cycle time, and thereby shortening the precursor and purge pulses, is at some point accompanied by an increase in the WtW. While the WtW for RCP1 and RCP2 lies around 1.5%, the WtW for RCP3 is observed to more than double and to degrade to about 4%.

Although illustrative embodiments of the present invention have been described above, in part with reference to the accompanying drawings, it is to be understood that the invention is not limited to these embodiments. Variations to the disclosed embodiments can be understood and effected by those skilled in the art in practicing the claimed invention, from a study of the drawings, the disclosure, and the appended claims. Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, it is noted that particular features, structures, or characteristics of one or more embodiments may be combined in any suitable manner to form new, not explicitly described embodiments.

The invention claimed is:

1. A method of manufacturing a solar cell having an effective minority charge carrier lifetime ($\tau_{eff}$) of at least 500 μs, said method comprising:
   providing a semiconductor wafer; and
   passivating a surface of said wafer by ALD-depositing a metal oxide layer on said surface by sequentially and alternatingly:
      (i) exposing said surface to a first precursor, resulting in a coverage of the surface with the first precursor, and
      (ii) exposing said surface to a second precursor, resulting in a coverage of the surface with the second precursor,
   wherein at least one of steps (i) and (ii) is stopped before the coverage of the surface reaches a saturation level.

2. The method according to claim 1, wherein the first precursor is a metal precursor and/or the second precursor is an oxidant.

3. The method according to claim 1, wherein the metal oxide layer is an aluminum oxide ($Al_2O_3$) layer.

4. The method according to claim 1, wherein the first precursor comprises trimethylaluminum (TMA).

5. The method according to claim 1, wherein the second precursor comprises ozone ($O_3$).

6. The method according to claim 1, wherein the wafer is a silicon wafer.

7. The method according to claim 1, wherein the reaction chamber is purged with an inert gas in between exposures of the surface of the wafer to different precursors.

8. The method according to claim 1, wherein the surface of the wafer is first exposed to a non-oxidant precursor.

9. The method according to claim 1, wherein the duration of step (i) is the range 1-15 seconds, preferably in the range 1-10 seconds, and more preferably in the range 1-5 seconds.

10. The method according to claim 1, wherein the duration of step (ii) is in the range 1-20 seconds, preferably in the range 1-10 seconds, and more preferably in the range 1-5 seconds.

11. The method according to claim 5, wherein the second precursor, to which the surface of the wafer is exposed during step (ii), has an ozone concentration in the range of 0.1-500 $g/m^3$, preferably in the range of 100-300 $g/m^3$, and more preferably about 220 $g/m^3$.

12. The method according to claim 7, wherein the time intervals during which the reaction chamber is purged in the range of 1-15 seconds, preferably in the range 1-10 seconds, and more preferably in the range 1-5 seconds.

13. The method according to claim 1, wherein the ALD cycle time is in the range of 10-70 seconds, preferably in the range of 10-25 seconds, and more preferably in the range of 10-15 seconds.

14. The method according to claim 1, wherein the wafer is maintained at a temperature in the range of 150-200° C. during deposition.

15. The method according to claim 1, wherein the wafer is located in an environment at a pressure in the range 100-200 mTorr.

16. The method according to claim 1, wherein the metal oxide layer has a thickness in the range of 10-30 nm, and preferably in the range of 15-25 nm.

17. The method according to claim 1, further comprising:
   ensuring a substantially uniform delivery of the first and second precursor to the wafer surface, in particular by rotating the wafer during deposition.

18. The method according to claim 1, wherein a batch of wafers, arranged in a stacked mutually spaced apart relationship, is provided in the reaction chamber, wherein each of said wafers has a surface, and wherein said surfaces of said wafers are all exposed to the first precursor during step (i) and to the second precursor during step (ii).

19. The method according to claim 2, wherein:
the metal oxide layer is an aluminum oxide ($Al_2O_3$) layer;
the first precursor comprises trimethylaluminum (TMA);
the second precursor comprises ozone ($O_3$);
the wafer is a silicon wafer;
the reaction chamber is purged with an inert gas, comprising nitrogen ($N_2$), in between exposures of the surface of the wafer to different precursors;
the surface of the wafer is first exposed to a non-oxidant precursor, comprising a metal precursor;
the duration of step (i) is the range 1-15 seconds, preferably in the range 1-10 seconds, and more preferably in the range 1-5 seconds; and
the duration of step (ii) is in the range 1-20 seconds, preferably in the range 1-10 seconds, and more preferably in the range 1-5 seconds.

20. The method according to claim 19, wherein:
the ALD cycle time is in the range of 10-70 seconds, preferably in the range of 10-25 seconds, and more preferably in the range of 10-15 seconds;
the wafer is maintained at a temperature in the range of 150-200° C. during deposition;
the wafer is located in an environment at a pressure in the range 100-200 mTorr;
the metal oxide layer has a thickness in the range of 10-30 nm, and preferably in the range of 15-25 nm;
a substantially uniform delivery of the first and second precursor is provided to the water surface, in particular by rotating the wafer during deposition; and
a batch of wafers, arranged in a stacked mutually spaced apart relationship, is provided in the reaction chamber, wherein each of said wafers has a surface, and wherein said surfaces of said wafers are all exposed to the first precursor during step (i) and to the second precursor during step (ii).

21. The method according to claim 7, wherein the inert gas comprises nitrogen ($N_2$).

22. The method according to claim 8, wherein the non-oxidant precursor comprises a metal precursor.

* * * * *